United States Patent [19]

Wei et al.

[11] Patent Number: 4,672,412
[45] Date of Patent: Jun. 9, 1987

[54] HIGH FILL-FACTOR AC-COUPLED X-Y ADDRESSABLE SCHOTTKY PHOTODIODE ARRAY

[75] Inventors: Ching-Yeu Wei, Schenectady; Henry H. Woodbury, Scotia, both of N.Y.

[73] Assignee: General Electric Company, Schenectady, N.Y.

[21] Appl. No.: 549,936

[22] Filed: Nov. 9, 1983

[51] Int. Cl.$^4$ .................................... H01L 27/14
[52] U.S. Cl. ......................... 357/30; 357/15; 357/32; 357/31; 357/45
[58] Field of Search .............. 357/15, 30, 30 H, 30 C, 357/32, 31, 45, 24, 23.1, 40

[56] References Cited

U.S. PATENT DOCUMENTS

| | | | |
|---|---|---|---|
| 3,786,263 | 1/1974 | Michon | 357/30 X |
| 3,805,062 | 4/1974 | Michon et al. | 357/30 X |
| 3,902,066 | 8/1975 | Roosild et al. | 250/332 |
| 3,983,395 | 9/1976 | Kim | 250/370 |
| 4,197,469 | 4/1980 | Cheung | 307/221 |
| 4,312,114 | 1/1982 | Schoular | 357/15 X |
| 4,327,291 | 4/1982 | Chapman et al. | 357/30 X |
| 4,450,465 | 5/1984 | Pimbley et al. | 357/31 X |

OTHER PUBLICATIONS

Capone et al., "Design and Characterization of a Schottky Infrared Charge-Coupled Device (IRCCD) Focal Plane Array", SPIE; vol. 267, 1981, Staring Infrared Focal Plane Technology, pp. 39–45.

Krakauer, et al., "Hot Carrier Diodes Switch in Picoseconos", Electrumcs, Jul. 19, 1983, pp. 53–55.

Arnold et al., "New Solid State Imaging Array with Reduced Switching Noise", 1971 IEEE Inti Solid State Circuits Cone, Feb. 18, 1981, pp. 128–129.

Weimar et al., "Multielement Self-Scanned Mosaic Sensors", IEEE Spectrum, Mar. 1969, pp. 52–65.

Cantella et al., "Solid State Focal Plane Arrays Boost Irsensor Capabilities", Military Electromics/Countermeasures, Sep. 1982, pp. 38–42.

Kimata et al., "Platinum Silicide Schottky-Barrier Ir-CCb Image Sensors", Jap. Jour. of Applied Physics, vol. 21 (1982), Supp. 21-1, pp. 231–235.

G. J. Michon, H. K. Burke, "CID Image Sensing", Topics in Applied Physics, vol. 38: Charge-Coupled Devices; Editor: D. F. Barbe, Springer-Verlag, Berlin, Heidelberg, New York (1980).

Primary Examiner—Andrew J. James
Assistant Examiner—William A. Mintel
Attorney, Agent, or Firm—John R. Rafter; James C. Davis, Jr.; Marvin Snyder

[57] ABSTRACT

Each unit cell of a Schottky barrier photodiode imaging array comprises a Schottky metal electrode formed on a silicon substrate. The Schottky electrode is reverse biased with a pulse for beginning a sensing interval, following which the change in charge on the electrode is related to the quantity of incident infrared radiation. For X-Y addressable readout, a row electrode and a column electrode are capacitively coupled to each Schottky electrode and connected to row and column address lines. For low overlap capacitance and low stray capacitance, the row and column electrodes are concentric within each cell and coplanar above the Schottky electrode. Over the row and column electrodes is an address line insulating layer, and sets of row and column address lines are coplanar over this layer. Separate segments of each row address line extend between adjacent electrode portions of correspondingly adjacent unit cells, and each column address line extends across a plurality of unit cells between the row address line segments. The address lines are connected to the underlying readout electrodes through contact windows in the address line insulating layer.

20 Claims, 7 Drawing Figures

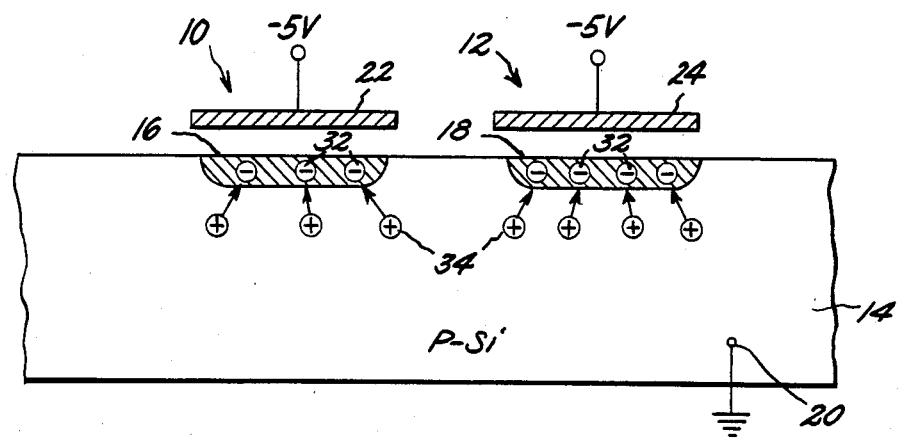
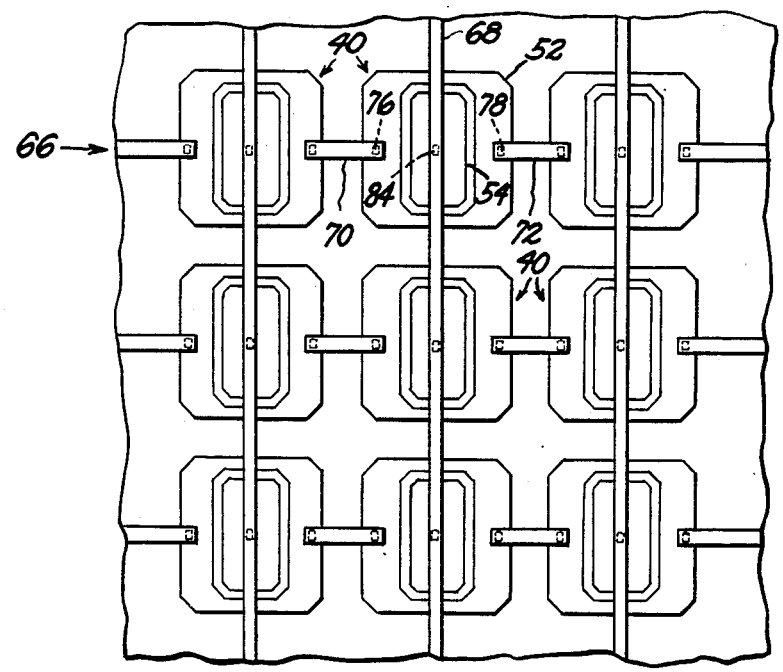

HIGH FILL-FACTOR AC-COUPLED X-Y ADDRESSABLE SCHOTTKY PHOTODIODE ARRAY

BACKGROUND OF THE INVENTION

The present invention relates to Schottky barrier infrared imaging arrays and, more particularly, to such arrays having increased fill-factor and capable of X-Y addressable readout.

Schottky barrier photodiode arrays have become increasingly attractive for infrared imaging systems. A single cell or picture element (pixel) of such an array, e.g., comprises a Schottky photodiode including a thin (e.g., 100 angstrom) layer of a metal silicide such as platinum silicide (PtSi) or palladium silicide (PdSi) formed on a semiconductor substrate. A typical example is a P-conductivity type silicon substrate. The metal Schottky electrode thus comprises the photodiode cathode, and the P-type silicon comprises the anode. For sensing operation the diode is reverse biased, defining in the semiconductor material underneath the Schottky metal electrode a depletion region wherein majority carriers (i.e., holes) are depleted and a positive charge appears on the Schottky metal electrode. Infrared photons striking the Schottky metal electrode generate electron-hole pairs and the excited holes cross the Schottky barrier (having a barrier height represented by $\phi_{SB}$) into the silicon. The photodiode is thus, in effect, discharged as the depletion region decreases in volume and the excess positive charges on the Schottky metal electrode decrease in number.

For infrared imaging purposes, Schottky photodiode arrays have a number of inherent advantages and unique characteristics compared to other types of infrared imagers such as metal-insulator-semiconductor (MIS) capacitors or ordinary junction diodes. One fundamental advantage is that it is much easier to achieve response to infrared radiation (e.g., wavelength in the range of 3 to 10 microns) while still employing silicon integrated circuit fabrication processes which are well developed in the art. This advantage arises from the fact that the spectral response is determined primarily by the physics of the barrier transition process and not by the photoabsorption process. In particular, during operation of a Schottky photodiode, electron-hole pairs are generated in the metal silicide rather than in the semiconductor, and the cut-off wavelength, in microns, is a function of the Schottky barrier height $\phi_{SB}$ in accordance with the expression $(1.24/\phi_{SB})$, where $\phi_{SB}$ is in electron volts. Barrier height, and thus spectral response, can be determined through such design choices as the particular metal employed and the semiconductor conductivity type.

In contrast, in a junction photodiode or in an MIS capacitor, electron-hole pairs are generated in the semiconductor material, and the cut-off wavelength, in microns, is determined in accordance with the expression $(1.24/E_g)$, where $E_g$ is the bandgap in electron volts. Silicon devices respond to visible wavelength photons, e.g., having a wavelength in the order of 0.7 microns. Where semiconductor-type imaging devices (e.g., MIS) are required to respond to infrared radiation, more exotic semiconductor materials must be employed, such as InSb or HgCdTe.

Another advantageous characteristic of Schottky barrier photodiodes when employed in arrays is that crosstalk between adjacent pixels inherently is substantially nonexistent and channel isolation between adjacent pixels is not required. This characteristic arises from the fact that the electrons, which represent the signal generated by the incident radiation, remain in the Schottky metal electrode so that the location of the electrons is well-defined.

Nevertheless, the advantageous characteristics of Schottky diode photodetectors have not heretofore been fully realized in arrays. Schottky photodiode arrays have previously been read out employing such elements as transfer gates and various forms of charge coupled devices (CCD's). The CCD's are typically arranged in shift-register fashion to serialize readout data from an entire row or column of the photodiode array. However, the presence of these additional elements for reading out the Schottky photodiodes makes somewhat less than 30% of the chip area available for photon detection. This factor, referred to in the art as the "fill-factor", is the ratio of actual detection area to the total chip area occupied by the array. Moreover, it is difficult to place the individual detection sites as close together as may be required for desired resolution. As a result, the advantageous characteristics of substantially no crosstalk and no requirement for channel isolation are not effectively utilized. These advantageous characteristics can be fully utilized only if the readout structure permits a closely-spaced array, but this has not been possible in the past.

A Schottky photodiode has relatively low quantum efficiency, and it is important for this reason also to use efficiently all the area available. A conflicting requirement with a CCD readout is that the CCD must be made large enough to handle the high infrared background charge often encountered. In addition, because a large number of charge transfers is required in a large area array, a buried channel CCD is normally preferred. However, the low charge handling capacity of the buried channel CCD requires a larger area of the silicon chip and hence reduces the fill-factor.

By way of example, Schottky barrier infrared detector arrays are disclosed in the following documents: Roosild et al., U.S. Pat. No. 3,902,066; B. R. Capone et al., "Design and Characterization of A Schottky Infrared Charge-Coupled Device (IRCCD) Focal Plane Array", SPIE vol. 267—Staring Infrared Focal Plane Technology, pp. 39–45 (1981); M. Kimata et al., "Platinum Silicide Schottky-Barrier IR-CCD Image Sensors", *Proceedings of the 13th Conference on Solid State Devices,* Tokyo, 1981; *Japanese Journal of Applied Physics,* vol. 21 (1982), Supplement 21-1, pp. 231–235; and M. Cantella et al., "Solid State Focal Plane Arrays Boost IR Sensor Capabilities", *Military Electronics/Countermeasures,* September 1982, pp. 38–42.

AC-coupled (capacitive) readout of PN junction photodiode arrays responsive to visible light has also previously been proposed. Exemplary disclosures are: P. K. Weimer et al., "Multielement Self-Scanned Mosaic Sensors", *IEEE Spectrum,* March 1969, pp. 52–65; and E. Arnold et al., "New Solid-State Imaging Array with Reduced Switching Noise", 1971 *IEEE International Solid-State Circuits Conference,* Feb. 18, 1971, pp. 128–129. Further, some imagers employing MIS capacitors include two MIS capacitors at each sensing site with the two capacitor electrodes connected directly and respectively to row and column lines for X-Y addressing. The two MIS capacitors are coupled together so that stored charge can be transferred from one capacitor to the other. For example, see G. J. Michon, U.S. Pat. No. 3,786,263, and Michon et al., U.S. Pat. No. 3,085,062, both assigned to the instant assignee.

Despite the relatively early suggestion in the Weimer et al. and Arnold et al. literature references (identified above) of AC-coupled PN junction photodiode arrays, capacitive-coupled readout of such devices has not met with success. Readout of PN junction photodiodes is typically accomplished with transfer gate and CCD techniques. As to Schottky photodiode arrays, capacitive readout has not been previously proposed. Instead, various transfer gate and CCD readouts have been employed, as noted above. As a result, the potential advantages of Schottky photodiodes have not been fully realized.

Accordingly, one object of the invention is to provide a high resolution two-dimensional solid-state infrared imaging array.

Another object is to provide a Schottky diode infrared imaging array fabricated on a silicon substrate.

Another object is to provide a highly sensitive infrared imaging array with virtually no inherent crosstalk or lag.

Another object is to provide a Schottky diode two-dimensional imaging array capable of high resolution readout without charge coupled devices.

Another object is to provide a Schottky photodiode array with a high fill factor.

SUMMARY OF THE INVENTION

Briefly, through appropriate structures and techniques, AC (capacitive) coupling is employed in Schottky photodiode arrays to achieve X-Y addressing with high fill-factor (greater than 90%), and close spacing of individual pixels for enhanced resolution. Specifically, a two-dimensional Schottky barrier infrared detector array comprises a semiconductor substrate of, for example, P-conductivity type silicon. A plurality of unit cells are formed on the substrate and arranged in a two-dimensional pattern of rows and columns. Each of the unit cells in turn includes a photosensitive Schottky barrier metal electrode formed on the semiconductor substrate defining a Schottky junction therewith, and a pair of readout electrodes, namely, a row electrode and a column electrode, electrically insulated from the Schottky electrode and capacitively coupled thereto. The overall array includes a set of row address lines, each corresponding to a row of unit cells and connected to the row electrodes of the unit cells of the corresponding row, and a set of column address lines, each corresponding to a column electrode of the unit cells of the corresponding column. As described in detail below, a "half-select" correlated double sampling technique can be employed to effectively read out this array.

The readout electrodes and address lines are physically arranged to significantly reduce stray capacitance, thereby increasing signal-to-noise ratio and descreasing pattern noise. (Undesirable pattern noise is normally evidenced by nonuniform readout in the presence of a uniformly black image.) Within each unit cell the row and column electrodes are concentrically arranged so that, for example, the row electrode surrounds the column electrode. Thus, the one electrode (in this example, the row electrode) comprises a pair of generally diametrically opposed, electrically connected, electrode portions. The two electrodes, i.e., the row and column electrodes, are substantially coplanar at a first level above the Schottky metal electrode, being spaced from the Schottky metal electrode by an insulating layer.

Over the row and column electrodes is an address line insulating layer, and the sets of row and column address lines are substantially coplanar at a second level above the Schottky metal electrodes and spaced from the row and column electrodes by the address line insulating layer. So that the row and column address lines do not overlap, each line of one of the address line sets (i.e., each row address line) comprises separate line segments, each segment extending between adjacent electrode portions of correspondingly adjacent unit cells. These line segments are electrically connected to the electrode portions through contact windows in the address line insulating layer. Each line of the other of the address line sets (i.e., each column address line) extends across a plurality of unit cells through the gaps between the line segments of the one set. Each column address line is connected through contact windows in the address line insulating layer to the column electrodes of the underlying unit cells. As a result, the address lines introduce relatively low stray capacitance and there is very low overlap capacitance between the row and column lines and the electrodes. In particular, there is no overlap capacitance between the electrodes themselves, and the only overlap capacitance in the entire array is between the column address lines and the relatively narrow portions of the row electrodes bridging the opposed electrode portions. A relatively thick layer of insulation, for example a 10,000 angstrom $SiO_2$ layer, minimizes even this capacitance.

In accordance with the invention, a method of operating a Schottky photodiode having a Schottky metal barrier electrode formed on a semiconductor substrate and defining a Schottky junction therewith includes the steps of capacitively coupling to the Schottky electrode a voltage pulse of magnitude and polarity appropriate to reverse bias the photodiode with a charge quantity therein. Thereafter, the magnitude of charge remaining in the photodiode is determined at the end of the sensing and integration interval by capacitively coupling a signal from the Schottky electrode.

BRIEF DESCRIPTION OF THE DRAWINGS

While the novel features of the invention are set forth with particularity in the appended claims, the invention, both as to organization and content, will be better understood and appreciated in the following detailed description, taken in conjunction with the drawings, in which:

FIG. 2 depicts the operation of the two photodiodes of FIG. 1A during a pulsed charging operation, or reset operation;

FIG. 5 is a view similar to FIG. 4 depicting a plurality of unit cells arranged in a two-dimensional pattern of rows and columns.

DETAILED DESCRIPTION

Figure 1A:
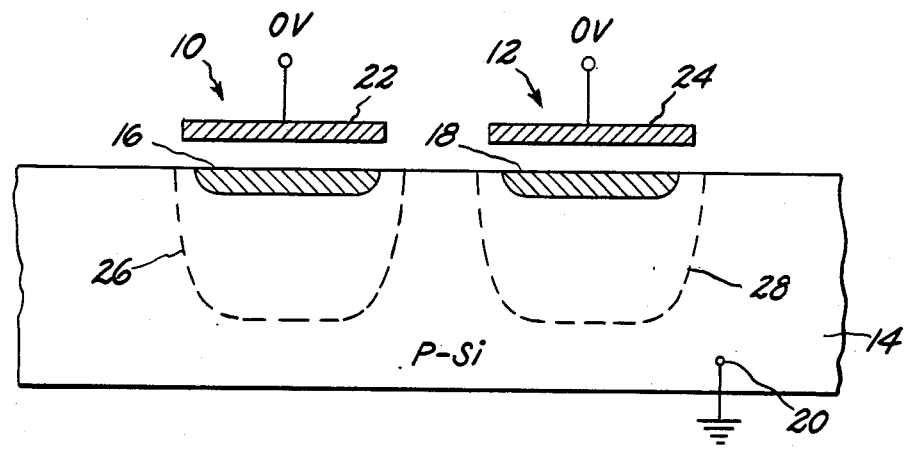
FIG. 1A is a cross-sectional representation of a pair of adjacent capacitively-coupled Schottky photodiodes depicting operation before photon detection.
Figure 1B:
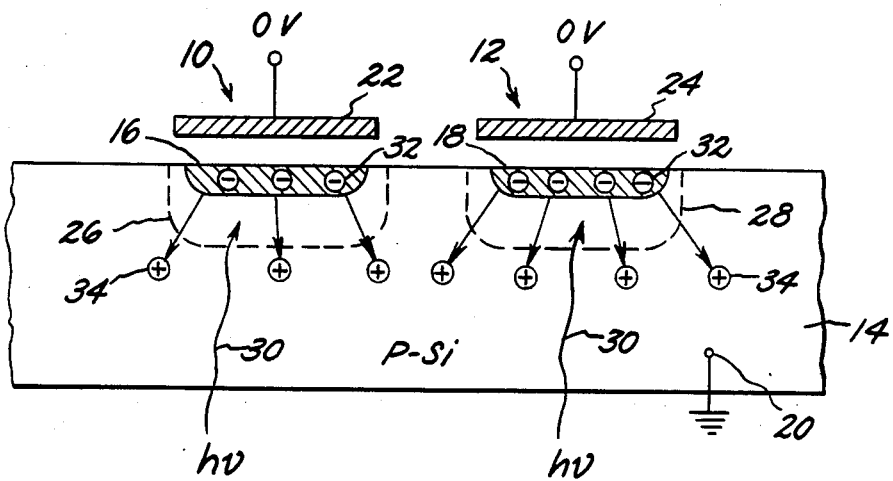
FIG. 1B is a cross-sectional representation of the two photodiodes of FIG. 1A during photon detection.

FIGS. 1A, 1B and 2 depict in highly-schematic fashion the operation of two capacitively-coupled Schottky photodiodes 10 and 12. Each of FIGS. 1A, 1B and 2 is additionally employed to illustrate certain advantages of such Schottky photodiodes compared to charge injection devices (CID's) and capacitor-coupled junction diodes.

In FIGS. 1A, 1B and 2, a P-conductivity silicon semiconductor substrate 14 has formed thereon a pair of Schottky metal barrier electrodes 16 and 18 defining Schottky junctions with semiconductor substrate 14. Inasmuch as semiconductor substrate 14 is of P-conductivity type, Schottky electrodes 16 and 18 comprise the diode cathodes and semiconductor substrate 14 comprises a common diode anode connected to a circuit reference point as schematically depicted at 20. Photodiodes 10 and 12 also include respective readout electrodes 22 and 24 capacitively coupled to corresponding Schottky metal electrodes 16 and 18.

In operation, electrodes 22 and 24, as depicted in FIG. 1A, are nominally at zero volts, although any initial bias voltage may be applied as, e.g., to control the surface potential of the substrate. Schottky metal electrodes 16 and 18, capacitively coupled to readout electrodes 22 and 24, each start with a positive potential $+V_1$. Thus, diodes 10 and 12 are each reverse biased, and respective depletion regions 26 and 28 are formed. In particular, majority carriers (holes in this case of the P-conductivity semiconductor substrate 14) are depleted from depletion regions 26 and 28, and excess positive charge is contained within the Schottky metal electrodes 16 and 18. However, for convenience in describing the physical mechanism of the present invention, this excess positive charge is omitted in FIGS. 1A, 1B and 2.

As incident photons, hv, along paths 30, as depicted in FIG. 1B, are absorbed by Schottky electrodes 16 and 18, electron-hole pairs are generated in the electrodes. While excited holes, represented at 34, cross the Schottky barrier into silicon substrate 14, electrons, represented at 32, remain in Schottky metal electrodes 16 and 18. Thus, while the positive bias remains, incident radiation is in effect integrated and depletion regions 26 and 28 decrease in volume depending upon the quantity of photons incident upon their respective Schottky metal electrodes 16 and 18. Diodes 10 and 12 are, in effect, discharged by an amount which may be designated $\Delta q$.

In contrast to other photosensitive devices, electrons 32, which reflect the quantity of incident radiation 30, are as a result of the absorption of incident radiation 30, in well-defined locations, namely, within Schottky metal electrodes 16 and 18. Thus, there is inherently very little chance of crosstalk between adjacent cells 10 and 12 since the signal-representing electrons are so contained. Moreover, even if depletion regions 26 and 28 were to overlap, adjacent pixels are not short-circuited. This is a direct consequence of the incapability of holes to escape from the Schottky electrode without a supply of external energy in the form of photons, for example.

The signal charge integrated in photodiodes 10 and 12 is then capacitively sensed by use of capacitive coupling between readout electrodes 22 and 24, respectively, and Schottky electrodes 16 and 18, respectively. This sensing technique is depicted in FIG. 2. Following the desired integration time of the signal, a negative voltage pulse, e.g., −5 volts, is applied to electrodes 22 and 24. This drives electrodes 22 and 24 negative for a duration of less than one microsecond. Holes 34 then rapidly return to Schottky electrodes 16 and 18 to recombine with electrons 32. Since recombination occurs nearly instantaneously in the metal (i.e., within a few nanoseconds), lag is virtually nonexistent. Thus, photodiodes 10 and 12 can again be charged for another integration interval with assurance that signal generated during one sensing interval does not substantially affect a subsequent sensing interval. The absence of crosstalk is also evident. Immediately after this negative voltage pulse the readout electrodes 22 and 24 are reset to 0 volts to establish the initial potential on the Schottky electrodes 16 and 18 as shown in FIG. 1A. The voltage changes on readout electrodes 22 and 24 between the FIG. 1A and FIG. 1B conditions provide the signal voltages for Schottky electrodes 16 and 18, respectively.

Although not specifically illustrated, a capacitively coupled junction photodiode, such as has been suggested in the prior art, may be visualized by replacing Schottky metal electrodes 16 and 18 with highly-doped N-conductivity type cathode regions (N+ cathodes). Although the structure is superficially quite similar to the device of FIGS. 1A, 1B and 2, the operation is not. Specifically, in operation of a capacitively coupled junction diode, electron and hole pairs are generated all over the semiconductor material, with electrons accumulating in the N+ cathode regions and holes accumulating in the substrate. During reset operation (depicted in FIG. 2 for the device of FIGS. 1A and 1B), electron current flows out of the N+ cathode, i.e., is injected into the substrate. Since it is electrons which flow during reset, the device may be considered a minority carrier device inasmuch as electrons are minority carriers with respect to the P-conductivity type substrate. On the other hand, Schottky photodiodes 10 and 12 may be considered majority carrier devices inasmuch as the dominant carriers which flow during reset are holes, which are the majority carriers with respect to underlying substrate 14. As a consequence of this injection of electrons into the substrate in a capacitively coupled junction diode, the injected electrons may be recollected in a subsequent readout cycle, resulting in substantial lag, or migrate to neighboring pixels, resulting in significant crosstalk.

An MIS capacitor charge-injection device (CID) may be visualized by entirely omitting Schottky metal electrodes 16 and 18. The charge-injection device operates substantially identically to a capacitively-coupled junction diode except that, in place of the defined N+ cathode region, an N-conductivity type inversion layer is formed adjacent the semiconductive surface. During reset, electrons from this inversion layer are injected into the substrate. Thus, unlike Schottky photodiodes, MIS charge-injection devices are minority carrier readout devices with corresponding lag and crosstalk problems.

Figure 3:
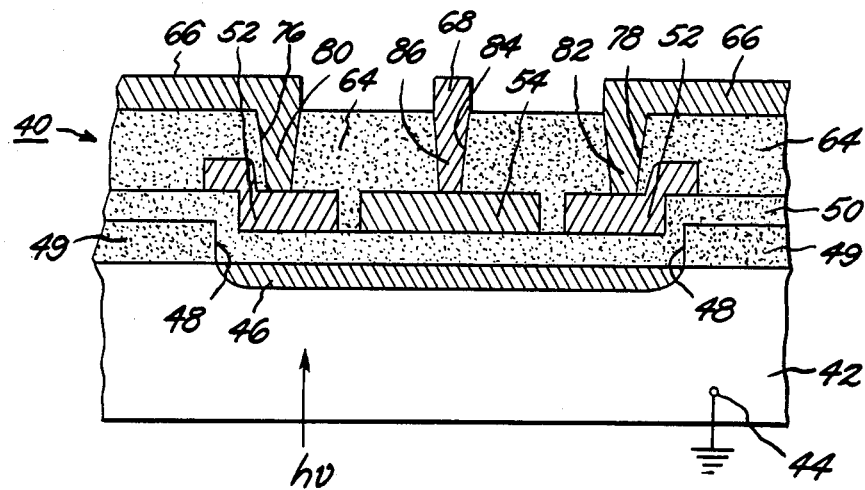
FIG. 3 is a cross-sectional representation of a single unit cell of a two-dimensional Schottky barrier infrared detector array.
Figure 4:
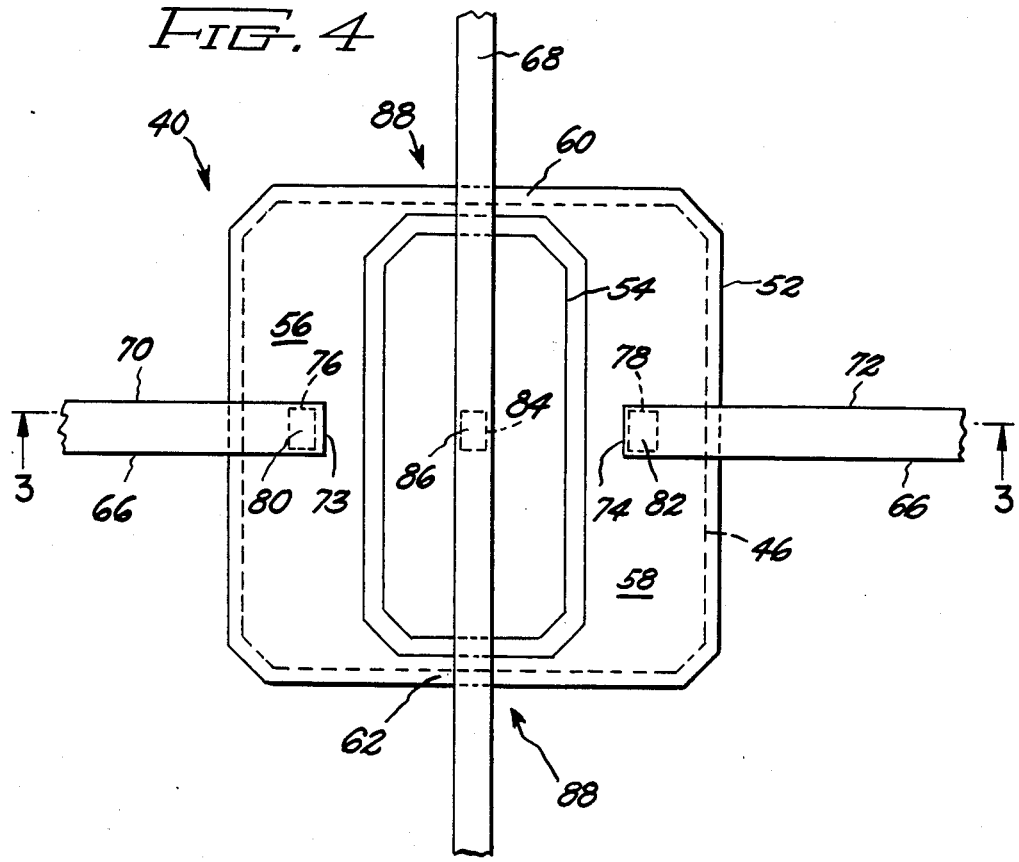
FIG. 4 is a plan view taken generally along lines 4—4 of FIG. 3 representing metal portions of the FIG. 3 cell.

FIGS. 3 and 4 are enlarged views of a single Schottky photodiode unit cell 40, while FIG. 5 depicts a portion of a two-dimensional array of such unit cells. The FIGS. 4 and 5 plan views, for clarity of illustration, depict only metal portions. Each unit cell or sensing site has an exemplary size of 43 by 43 midrometers and, as will be appreciated from FIGS. 4 and 5, the fill-factor is relatively high because the sensing area and readout area are substantially overlapped.

As shown in FIG. 3, unit cell 40 is formed on a P-conductivity type silicon semiconductor substrate 42, common to all the other unit cells and comprising a photodiode common anode. Substrate 42 is connected to a circuit reference point as depicted at 44. A film-like photosensitive Schottky barrier metal electrode 46 is formed on semiconductor substrate 42 and defines a Schottky junction therewith. This Schottky electrode 46, which also may be viewed as defining a sensing site, preferably comprises platinum silicide (PtSi).

In accordance with conventional processing techniques, Schottky metal electrode 46 may be formed by initially depositing a platinum film at cold substrate temperature (less than 100° C. employing an electron beam evaporation technique. Masking during this deposition process is provided by a window 48 in a silicon oxide ($SiO_2$) layer 49. The platinum film is then converted into platinum silicide by annealing at a temperature in the range of 350° C. to 650° C. In order to provide a more uniform platinum silicide film, the conventional process for forming the film may be improved by depositing platinum on a hot (in the order of 600° C.) substrate to yield a more nearly continuous and single-phase platinum silicide film.

Following the platinum silicide formation, a silicon nitride ($Si_3N_4$) insulating layer 50 is formed directly over platinum silicide film 46. The thickness of silicon nitride layer 50 is chosen for an optimized noise and saturation charge, and is in the order of from 2,000 to 10,000 angstroms. Silicon nitride has the advantages of low pinhole density and excellent radiation hardness.

Patterned on the silicon nitride layer 50 are aluminum row and column electrodes 52 and 54, respectively. Electrodes 52 and 54 are substantially coplanar at a first level above Schottky metal 46, as shown in FIG. 3. Electrodes 52 and 54 are concentrically arranged, as shown in FIG. 4, with row electrode 52, for example, comprising a pair of generally diametrically-opposed electrode portions 56 and 58, electrically interconnected by relatively narrow connecting portions 60 and 62. In addition, row electrode 52 extends beyond the platinum silicide sensing area 46 to serve as an MOS guard ring for raising the reverse breakdown voltage of the photodiode by smoothing out the depletion layer edge curvature. This extension is in the order of one micrometer.

Next, an address line insulating layer 64 is formed over the row and column electrodes 52 and 54. Insulating layer 64 may comprise silicon oxide ($SiO_2$) of thickness in the order of 10,000 angstroms.

Row and column address lines 66 and 68, respectively, are formed over insulating layer 64 substantially coplanar at a second level above Schottky electrode 46 and spaced from row and column electrodes 52 and 54 by insulating layer 64.

Each line of one of the address line sets, for example row address line 66, comprises a plurality of segments, such as segments 70 and 72, as shown in FIG. 4, extending between adjacent electrode portions of corresponding adjacent unit cells 40, as may be seen in FIG. 5. Gaps are thus defined between line segment ends 73 and 74, as shown in FIG. 4. Row address line segments 70 and 72 are electrically connected to row electrode portions 56 and 58, respectively, through contact windows 76 and 78, respectively, in address line insulating layer 64 via metal extensions 80 and 82, respectively.

Each line of the other address line sets, such as column line 68, extends across a plurality of unit cells through the gaps between row line segments 70 and 72. Column line 68 is electrically connected through a contact window 84 to column electrode 54 via a metalized extension 86.

The structure thus described provides relatively low address line stray capacitance and relatively low overlap capacitance, both of which are at least an order of magnitude less than in conventional electrode designs. In particular, the address line insulating layer 64 is relatively thick, for minimal capacitance. The only address line overlap occurs at points 88 (FIG. 4) where column address line 68 overlaps row electrode connecting portions 60 and 62. As previously noted, connecting portions 60 and 62 are relatively narrow, and the insulation layer 64 is relatively thick. In designing the AC coupled Schottky photodiode array, it is desirable to maintain minimal column and row capacitances in order to minimize noise and drive power requirements, but not so small as to render stored capacity ineffective and cause excessive readout attenuation.

Figure 6:
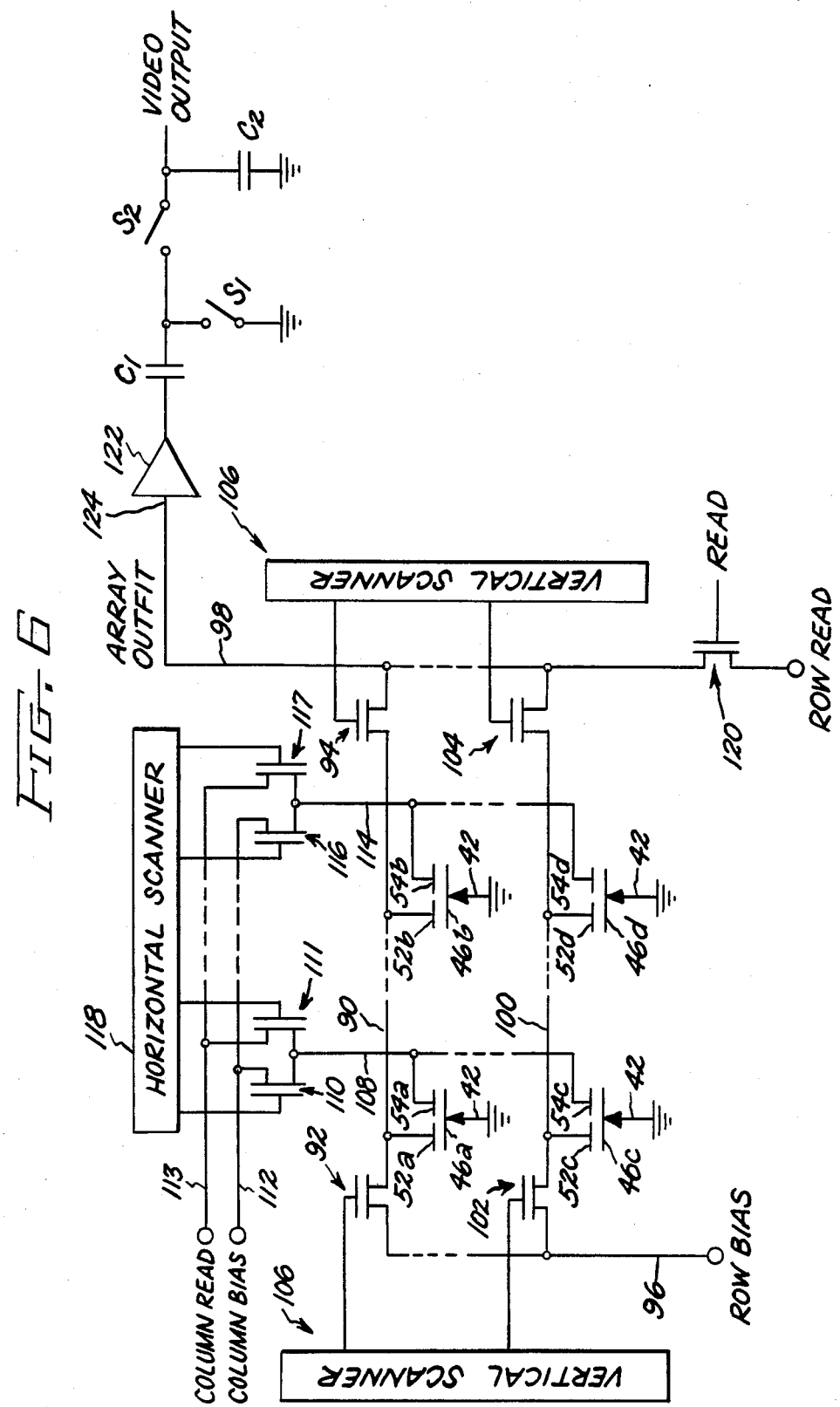
FIG. 6 is an electrical schematic diagram depicting an array such as shown in FIG. 5 and illustrating readout circuitry therefor.

FIG. 6 is an equivalent electrical schematic diagram representing the FIG. 5 array and depicting the manner in which the individual unit cells are connected for readout. In FIG. 6, the photodiode common anode is represented at 42, and individual photodiode cathodes (comprising Schottky metal electrodes) are represented at 46a–46d. Row readout electrodes 52a–52d, respectively, are capacitively coupled to respective Schottky electrodes 46a–46d, and column readout electrodes 54a–54d, respectively, are capacitively coupled to respective Schottky metal electrodes 46a–46d.

A representative row address line 90 is connected to both row electrodes 52a and 52b of the corresponding row and, through gating transistors 92 and 94, to a row drive line 96 and an output line 98, respectively. Another representative row address line 100 is connected to row address electrodes 52c and 52d of another row and, through gating transistors 102 and 104, to row drive line 96 and output line 98, respectively. Gating transistors 92, 94, 102 and 104 are activated by conventional vertical scanning circuitry 106.

In similar fashion, a representative column address line 108 is connected to column address electrodes 54a and 54c of the corresponding column and, through a gating transistor 110, to a column bias line 112, and through a gating transistor 111 to a column read line 113. Another representative column address line 114 is connected to column electrodes 54b and 54d and, through a gating transistor 116, to column bias line 112, and through a gating transistor 117 to column read line 113. Horizontal scanning circuitry 118 selectively activates gating transistors 110, 111, 116 and 117. Output line 98 is connected through a voltage amplifier 122 to a correlated double voltage sampling network comprising capacitors $C_1$ and $C_2$, and switches $S_1$ and $S_2$.

In the array operation, a selected pixel is initially reset by applying a negative pulse by switching on the corresponding row and column read lines simultaneously. As a result, the selected pixel is forward biased to a potential of the order of −0.2 volt and all excess electrons and holes within the Schottky electrode of the selected pixel recombine.

The sensing operation begins following the reset/read pulse when the photodiode cathode is reverse biased. In the manner described hereinabove with reference to FIG. 1A, a depletion region underneath the Schottky electrode of the selected pixel is formed wherein majority carriers (holes) are depleted. Excess positive charges are created in the Schottky electrode of the selected pixel.

During sensing and integration for one time frame, infrared photons absorbed in the Schottky metal cathode of the selected pixel cause generation of electron-hole pairs as described previously. As excited holes cross the Schottky barrier into the silicon, the photodiode depletion region decreases in volume and the excess positive charges on the Schottky metal cathode decrease in number. The selected pixel is, in effect, discharged by an amount $\Delta q$ dependent upon the quantity of infrared photons striking the selected pixel. At the end of one time frame of integration, readout begins. Reset, sensing, integration and readout proceeds for all the pixels sequentially row-by-row, and column-by-column within each row. When the last pixel is read, the sequence is immediately repeated. Since each pixel is reset when it is read out, the integration time for all pixels is the same and equal to the frame time.

In particular, referring to FIG. 6, a first row is selected for readout at the end of its one frame time of integration. In a "half-select" operation, the row capacitors $52a$ and $52b$ in the selected row are coupled through transistors 94 and 120 to the row read potential, e.g., $-5$ volts, and then allowed to float by opening transistor 120. Each pixel along the selected row is only "half-selected" because only one of the two electrodes capacitively coupled to the single Schottky metal electrode is driven to $-5$ volts, reducing the potential on the Schottky metal electrodes $46a$ and $46b$ by an amount of $+V_1/2$. The voltage $V_r$ on each sensing site within the selected row then reduces to:

$$V_r = V_1 - \frac{V_1}{2} - \frac{\Delta q}{C_p} \quad (1)$$

where $\Delta q$ is the integrated signal charge and $C_p$ is the total capacitance for each pixel. It is assumed here that for each pixel the row gate capacitance and column gate capacitance are equal. However, this is only for illustration and in practice need not be the case. Due to the half-select operation, the saturation value $\Delta q_{max}$ for each pixel is given by:

$$q_{max} = C_p \cdot \frac{V_1}{2} \quad (2)$$

Note that no signal charge is removed from the Schottky electrodes $46a$ and $46b$ during the "half-select" operation as long as the integrated signal charge does not exceed $\Delta q_{max}$.

Next, correlated double voltage sampling is used to read out each pixel of the selected row, column-by-column. Initially, the first sample of output line 98 voltage is taken across capacitor $C_1$ by momentarily closing switch $S_1$. The first column is then pulsed negatively and brought back to its bias potential by horizontal scanner 118. This can be done by momentarily opening transistor switch 111 and closing transistor switch 110. While Schottky photodiode readout electrodes $54a$, $54c$ are at the more negative potential, the selected Schottky photodiode $46a$ is forward biased and the integrated charge on the Schottky electrode $54a$ thereof is removed via a recombination procedure as described previously. When the column line returns to its bias potential, the cathode potential of the photodiode $46a$ will have changed to $V_1 - V_1/2$ (neglecting the 0.2 volt diode cut-on voltage). The row voltage at the preamp input node 124 will have changed by $\Delta q/C_T$, where $C_T$ is a total line capacitance. This second voltage sample is taken by momentarily closing switch $S_2$. The charge on capacitor $C_2$ at this time reflects $\Delta q/C_T$. Note that $C_T$ replaces $C_p$ due to the associated capacitances of other pixels in the selected row. The next column is then chosen and pulsed. Correlated double sampling is again used to read out the accumulated change in charge on the Schottky electrode $46b$ of the next selected pixel. No signal charge is removed from the Schottky electrodes $46c$ and $46d$ in the unselected row when the column electrodes $54c$ and $54d$ are pulsed to ground potential since the unselected row electrodes $52c$ and $52d$ are at a positive potential $+V_1/2$. All columns along the row are read out although this need not be the case for random access.

Following the row readout, e.g., row 90, transistor 94 connecting the row to the output line is opened and transistor 92 is closed connecting the row to the row bias terminal. The next row (e.g. 100) is then chosen and read out. This continues for all rows and columns.

The row bias and column bias are nominally at 0 volts. In actual operation, as described hereinbefore, they can be at any d.c. potential with the column read and row read potentials being more negative, e.g. 5 volts, than the column and row bias potentials, respectively.

This readout approach results in virtually no "blooming", and minimal "photo current effect". The term "blooming" is employed to describe crosstalk due to pixels containing photocharge in excess of the saturation value. The term "photo current effect" is employed to describe crosstalk due to integration of charge in nonsaturated pixels.

If any particular site integrates more charge than the saturation value given by Equation (1) above, the excess charge is cleared out during the half-select operation. The charge read out during that pixel time will be $\Delta q_{max}$. Saturated sites along the same row, but not yet read out, are maintained at constant voltage by the forward bias condition, and do not bloom into the selected site. Saturated sites along the same row which have already been read out will have already been cleared and, therefore, cannot cause overload blooming.

The photocurrent effect more specifically is a crosstalk effect due to the addition of photocharge into sites other than the chosen site while the chosen site is being read out. A heavy (greater than 100 times) overload in a pixel which has just been read out (i.e., already cleared and now integrating) may lead to a darkened streak in the image.

The preferred embodiment described above utilizes concentric, planar row and column gates and planar row and column address lines. It is to be understood, however, that side-by-side row/column gates (nonconcentric), either planar or non-planar, and address lines at different levels (non-planar), or other such geometrical variations, can be adopted and still maintain the beneficial results described herein.

The foregoing describes a high-resolution two-dimensional solid-state imaging array with a high fill-factor and yet virtually no inherent crosstalk or lag. By fabricating a Schottky diode array on a silicon substrate, highly sensitive infrared imaging may be achieved without use of charge coupled devices for readout.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A Schottky barrier infrared detector array comprising:
   a semiconductor substrate having first and second separate surfaces;
   a plurality of unit cells formed on said substrate and arranged in a pattern of rows and columns;
   each of said unit cells including:
   means disposed in said first surface for receiving incident radiation;
   a photosensitive Schottky barrier metal electrode formed on said second surface of said semiconductor substrate and defining a Schottky junction therewith, and
   a row electrode and a column electrode electrically insulated from said Schottky barrier metal electrode and capacitively coupled to said Sckottky barrier metal electrode, said row and column electrodes overlapping a substantial portion of said Schottky barrier metal electrode so as to achieve a high fill factor;
   a set of row address lines each corresponding to a row of said plurality of unit cells and connected to the row electrodes of the unit cells of the corresponding row; and
   a set of column address lines each corresponding to a column of said plurality of unit cells and connected to the column electrodes of the unit cells of the corresponding column.

2. The infrared detector array in accordance with claim 1, wherein within each unit cell said row and column electrodes are concentrically arranged with one of said row and column electrodes surrounding the other of said row and column electrodes such that at least said one of said row and column electrodes comprises a pair of generally diametrically opposed and electrically connected electrode portions.

3. The infrared detector array in accordance with claim 2, wherein said row and colum electrodes are substantially coplanar at a first level above said Schottky electrode.

4. The infrared detector array in accordance with claim 3, further comprising an address line insulating layer over said row electrode and said column electrode, said set of row address lines and said set of column address lines being substantially coplanar at a second level above said Schottky barrier metal electrode and spaced from said row electrode and column electrode by said address line insulating layer.

5. The infrared detector array in accordance with claim 4 wherein:
   each line of one of said set of row address lines and said set of column address lines comprises a plurality of line segments extending between adjacent electrode portions of said row and column electrodes of corresponding adjacent unit cells, and electrically connected to said electrode portions of said one of said row and column electrodes through contact windows in said address line insulating layer, and wherein
   each line of the other of said set of row address lines and said set of column address lines extends across a plurality of said unit cells through gaps between said segments of the lines of said one set, and is electrically connected through contact windows in said address line insulating layer to said other of said row and column electrodes of each of the unit cells of said plurality.

6. The infrared detector array in accordance with claim 5, wherein said diametrically opposed electrode portions are electrically connected by relatively narrow connecting portions for minimal overlap capacitance with the lines of said other of said line sets.

7. The infrared detector array in accordance with claim 1, wherein said semiconductor substrate comprises silicon.

8. A Schottky barrier infrared detector element comprising:
   a semiconductor substrate having a first surface and a second surface, said first surface being separate from said second surface;
   a photosensitive Schottky barrier metal electrode formed on said first surface of said semiconductor substrate and defining a Schottky junction therewith; said second surface of said semiconductor substrate including means for receiving incident radiation and
   at least one readout electrode overlying a substantial portion of said Schottky barrier metal electrode and being electrically insulated from and capacitively coupled to said Schottky barrier metal electrode.

9. The Schottky barrier infrared detector element in accordance with claim 8, wherein said semiconductor substrate comprises silicon.

10. A method of operating a Schottky photodiode having a semiconductor substrate including first and second separate surface, a Schottky barrier metal electrode formed on said first surface of semiconductor substrate and defining a Schottky junction therewith and having means for receiving incident radiation disposed in said second surface of said semiconductor substrate, said method comprising:
    capacitively coupling to a substantial portion of the Schottky barrier metal electrode an electrical pulse of voltage magnitude and polarity appropriate to reverse bias the photodiode with a charge quantity therein; and
    exposing a second surface of said semiconductor substrate to incident radiation,
    coupling an infrared portion of said incident radiation to said Schottky junction,
    sensing the infrared portion of the incident radiation,
    determining the magnitude of charge remaining in the photodiode at the end of a sensing and integration interval by capacitively coupling a signal from the Schottky barrier metal electrode.

11. The Schottky barrier infrared detector element in accordance with claim 8, further including a second readout electrode, said second electrode including a pair of generally diametrically opposed and electrically connected portions positioned on opposite sides of a portion of said first electrode.

12. An infrared imaging array disposed in a semiconductor substrate and exhibiting a high fill-factor including a plurality of closely spaced Schottky barrier infrared detector elements each comprising:
  a portion of said semiconductor substrate having a first radiation receiving surface and a second detector surface said first radiation receiving surface and second detector surfaces being disposed on nonadjacent surfaces of said semiconductor substrate;
  a photosensitive Schottky barrier metal electrode disposed in registry with said second detector surface and forming a Schottky barrier junction therewith; and
  a readout electrode overlapping a substantial portion of said Schottky barrier metal electrode and being electrically insulated from and capacitively coupled to said Schottky barrier metal electrode, and
  said first radiation receiving surface comprising greater than 30 percent of the corresponding substrate surface.

13. The Schottky barrier infrared detector array of claim 1, further comprising an insulating layer overlying said Schottky barrier metal electrode.

14. The Schottky barrier infrared detector array of claim 1, wherein said insulating layer is disposed between said Schottky metal electrode and said row and column electrodes.

15. The Schottky barrier detector array of claim 1, wherein said Schottky barrier metal electrode overlaps said means disposed in said first surface for receiving incident radiation.

16. The Schottky barrier detector array of claim 15 wherein said means disposed in said first surface for receiving incident radiation is at least coextensive with said Schottky barrier metal electrode.

17. The Schottky barrier detector of claim 1, wherein:
  said means disposed in said first surface for receiving incident radiation includes means for coupling incident infrared radiation to said Schottky junction for detection.

18. The Schottky barrier detector of claim 17, wherein:
  said means for coupling incidents infrared radiation to said Schottky junction includes a portion of said semiconductor substrate between said first and second separate surfaces.

19. The Schottky barrier detector of claim 1 wherein said first and second surfaces comprise first and second opposed surfaces.

20. The Schottky barrier detector of claim 12 wherein said first radiation receiving surface and said second detector surface are disposed on opposite surfaces of said semiconductor substrate.

* * * * *